(12) United States Patent
Hsu et al.

(10) Patent No.: US 9,024,422 B2
(45) Date of Patent: May 5, 2015

(54) PACKAGE STRUCTURE HAVING EMBEDDED SEMICONDUCTOR COMPONENT AND FABRICATION METHOD THEREOF

(71) Applicant: Unimicron Technology Corporation, Taoyuan (TW)

(72) Inventors: Shih-Ping Hsu, Taoyuan (TW); I-Ta Tsai, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 14/046,000

(22) Filed: Oct. 4, 2013

(65) Prior Publication Data
US 2014/0035138 A1 Feb. 6, 2014

Related U.S. Application Data

(60) Continuation of application No. 13/865,220, filed on Apr. 18, 2013, now Pat. No. 8,580,608, which is a division of application No. 13/160,911, filed on Jun. 15, 2011, now abandoned.

(30) Foreign Application Priority Data

Nov. 1, 2010 (TW) ............................... 99137412 A

(51) Int. Cl.
*H01L 23/02* (2006.01)
*H01L 23/498* (2006.01)
(Continued)

(52) U.S. Cl.
CPC ........ *H01L 23/49816* (2013.01); *H01L 21/561* (2013.01); *H01L 21/563* (2013.01); *H01L 21/568* (2013.01); *H01L 23/3128* (2013.01); *H01L 23/562* (2013.01); *H01L 25/0655* (2013.01); *H01L 2224/16225* (2013.01);
(Continued)

(58) Field of Classification Search
CPC ............ H01L 23/488; H01L 23/49816; H01L 23/528; H01L 23/538; H01L 23/5389
USPC ......... 257/678, 690, 698, 737, 738, 758, 774, 257/778, 779, 780, 787, E23.011, E23.021
See application file for complete search history.

(56) References Cited

U.S. PATENT DOCUMENTS 7,443,030 B2 * 10/2008 Muthukumar et al. ....... 257/758
2005/0269687 A1 12/2005 Forcier
(Continued)

*Primary Examiner* — Hoai V Pham
(74) *Attorney, Agent, or Firm* — Mintz Levin Cohn Ferris Glovsky and Popeo, P.C.; Peter F. Corless; Steven M. Jensen

(57) ABSTRACT

A package structure having an embedded semiconductor component, includes: a chip having an active surface with electrode pads and an inactive surface opposite to the active surface; a first insulating protection layer having a chip mounting area for the chip to be mounted thereon via the active surface thereof; a plurality of connection columns disposed in the first insulating protection layer at positions corresponding to the electrode pads and electrically connected to the electrode pads via solder bumps; an encapsulant formed on one surface of the first insulating protection layer having the chip mounted thereon for encapsulating the chip; and a built-up structure formed on the other surface of the first insulating protection layer and the connection columns. Due to the bending resistance of the encapsulant, the warpage of the built-up structure is prevented.

5 Claims, 4 Drawing Sheets

(51) Int. Cl.
*H01L 21/56* (2006.01)
*H01L 23/31* (2006.01)
*H01L 25/065* (2006.01)
*H01L 21/58* (2006.01)
*H01L 23/00* (2006.01)

(52) U.S. Cl.
CPC ............... *H01L2224/73204* (2013.01); *H01L 2224/32225* (2013.01); *H01L 21/58* (2013.01)

(56) References Cited

U.S. PATENT DOCUMENTS

| | | |
|---|---|---|
| 2010/0140759 A1 | 6/2010 | Pagaila et al. |
| 2010/0200970 A1 | 8/2010 | Zhang |
| 2010/0320577 A1 | 12/2010 | Pagaila et al. |
| 2012/0061853 A1* | 3/2012 | Su et al. .................. 257/778 |
| 2012/0146209 A1* | 6/2012 | Hu et al. .................. 257/692 |

* cited by examiner

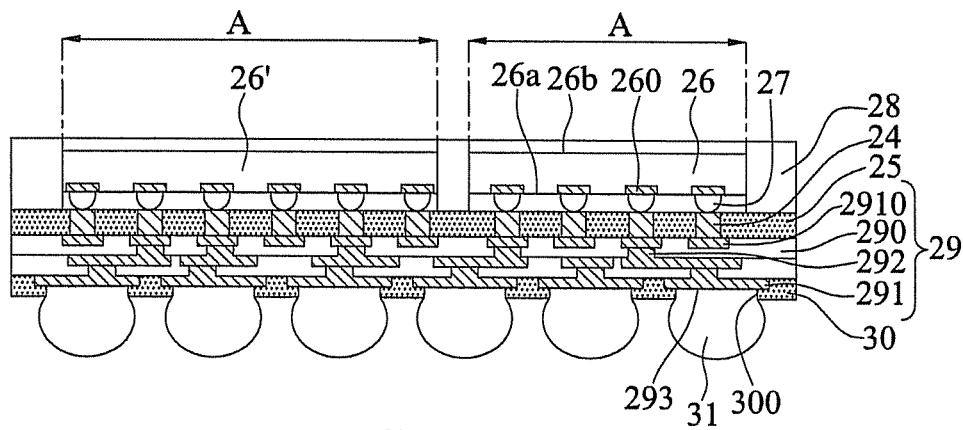
FIG. 2F
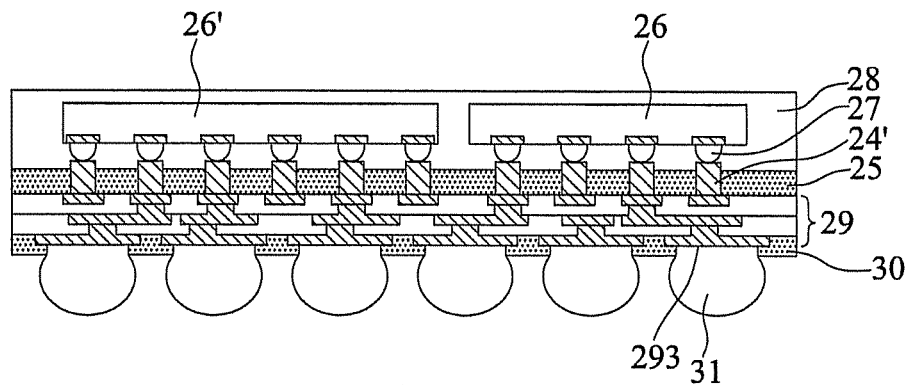
FIG. 2F'
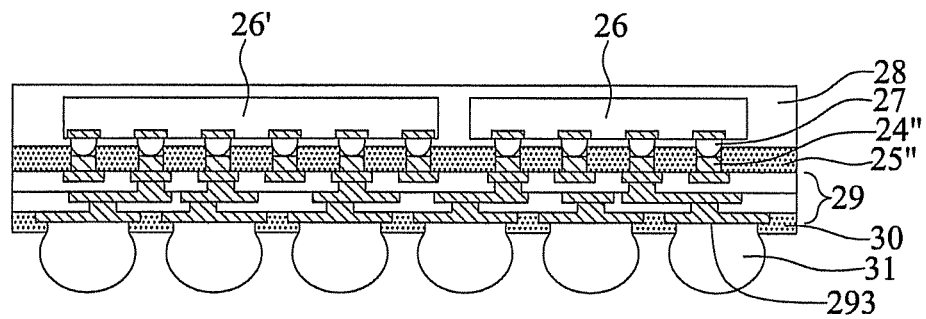
FIG. 2F"

PACKAGE STRUCTURE HAVING EMBEDDED SEMICONDUCTOR COMPONENT AND FABRICATION METHOD THEREOF

CROSS-REFERENCE TO RELATED APPLICATIONS

This application is a continuation of copending application U.S. Ser. No. 13/865,220, filed on Apr. 18, 2013, which is a divisional of copending application U.S. Ser. No. 13/160,911, filed on Jun. 15, 2011, which claims under 35 U.S.C. §119(a) the benefit of Taiwanese Application No. 099137412, filed Nov. 1, 2010, the entire contents of which are incorporated herein by reference.

BACKGROUND OF THE INVENTION

1. Field of the Invention

The present invention relates generally to package structures and fabrication methods thereof, and more particularly, to a package structure having an embedded semiconductor component and a fabrication method thereof.

2. Description of Related Art

Along with the rapid development of electronic industries, electronic products are becoming lighter, thinner, shorter and smaller and developed towards high integration and multi-function. To meet the requirement of high integration and miniaturization for package structures, a BGA substrate design is introduced into packaging substrates and further the packaging type is developed from wire bonding type or flip chip type to a type of embedding such as an IC semiconductor chip in a packaging substrate so as to reduce the size of the overall semiconductor device and improve the electrical performance thereof.

On the other hand, single chip packaging types are being replaced by 3D and modular packaging types so as to obtain multi-chip SIP (system in package) packages.

FIG. 1A is a cross-sectional view of a conventional flip-chip coreless package structure. Referring to FIG. 1A, the package structure comprises a substrate 10, a solder mask layer 12 formed on the substrate 10, a chip 14 flip-chip mounted on the solder mask layer 12, and an underfill 16 filled between the chip 14 and the solder mask layer 12.

Therein, the substrate 10 has a first surface 10a and a second surface 10b opposite to the first surface 10a. The substrate 10 has at least a dielectric layer 100, a wiring layer 101 formed on the dielectric layer 100 and a plurality of conductive vias 102 formed in the dielectric layer 100 and electrically connecting the wiring layer 102. Further, the wiring layer 102 comprises a plurality of first conductive pads 103 and a plurality of second conductive pads 104 exposed from the first surface 10a and the second surface 10b, respectively.

The solder mask layer 12 is formed on the first and second surfaces 10a, 10b of the substrate 10 and has a plurality of openings 120 for exposing the first and second conductive pads 103, 104, respectively, wherein the second conductive pads 104 are used for electrically connecting an external electronic device.

The chip 14 is flip-chip mounted on the solder mask layer 12 on the first surface 10a of the substrate 10. The chip 14 has an active surface 14a with a plurality of electrode pads 140 and an inactive surface 14b opposite to the active surface 14a, and the electrode pads 140 are electrically connected to the conductive pads 103 through solder bumps 15.

The underfill 16 is filled between the solder mask layer 12 and the active surface 14a of the chip 14 so as to encapsulate the solder bumps 15.

However, since the substrate 10 has an asymmetrical structure, it can easily deform due to an uneven force that causes the warpage of the overall structure, thus adversely affecting the electrical connection quality and reliability of the overall structure and reducing the product yield.

Further, since the package structure of FIG. 1A lacks the support of a core board, it results in an insufficient strength and easily causes the warpage of the overall structure. As such the electrical connection quality of the package structure as well as the underfill process are adversely affected.

FIG. 1B is a cross-sectional view of a conventional package structure having an embedded semiconductor component. Referring to FIG. 1B, the package structure comprises a core board 19 having opposite first and second surfaces 19a, 19b and a cavity 190 penetrating the first and second surfaces 19a, 19b; a chip 11 disposed in the cavity 190; a built-up structure 17 formed on the first and second surfaces 19a, 19b of the core board 19 and the chip 11; and a solder mask layer 18 formed on the built-up structure 17.

The chip 11 has an active surface 11a with a plurality of electrode pads 110 and an inactive surface 11b opposite to the active surface 11a. The chip 11 is fixed in the cavity 190 through an adhesive material 191.

The built-up structure 17 has at least a dielectric layer 170, a wiring layer 171 formed on the dielectric layer 170, and a plurality of conductive vias 172 formed in the dielectric layer 170 and electrically connecting the electrode pads 110 and the wiring layer 171.

The solder mask layer 18 has a plurality of openings 180 such that portions of the wiring layer 171 are exposed from the solder mask layer 18 to function as conductive pads for electrically connecting another electronic device.

The cavity 190 of the package structure of FIG. 1B is formed by using laser or a milling cutter. However, the laser process cannot be applied to a core board 19 with a thickness greater than 0.3 mm. Although there is no thickness limitation for a cutting process using a milling cutter, the process is time-consuming and has low accuracy.

Therefore, it is imperative provide a package structure and a fabrication method thereof so as to overcome the above-described drawbacks.

SUMMARY OF THE INVENTION

Accordingly, the present invention provides a package structure having an embedded semiconductor component and a fabrication method thereof so as to prevent warpage.

In order to achieve the above and other objects, the present invention provides a package structure having an embedded semiconductor component, which comprises: a chip having an active surface with a plurality of electrode pads and an inactive surface opposite to the active surface; a first insulating protection layer having a chip mounting area for the chip to be mounted thereon, wherein the chip is mounted on the chip mounting area via the active surface thereof; a plurality of connection columns disposed in the first insulating protection layer at positions corresponding to the electrode pads and electrically connected to the electrode pads through solder bumps so as to form a plurality of joints between the connection columns and the solder bumps; an encapsulant formed on one surface of the first insulating protection layer having the chip mounted thereon for encapsulating the chip and filling the spaces between the joints; and a built-up structure formed on the other surface of the first insulating protection layer and the connection columns.

The present invention further provides a fabrication method of a package structure having an embedded semiconductor component, which comprises the steps of: providing a carrier board having two opposite surfaces and having a core layer, a first metal layer formed on two opposite surfaces of the core layer, a release layer formed on the first metal layer and a second metal layer formed on the release layer; performing a patterning process to form a plurality of connection columns on the second metal layer and expose portions of the second metal layer; forming a first insulating protection layer on the exposed portions of the second metal layer, the connection columns being exposed from the first insulating protection layer; mounting at least a chip on the connection columns, wherein the chip has an active surface with a plurality of electrode pads and an inactive surface opposite to the active surface, the electrode pads being electrically connected to the connection columns through a plurality of solder bumps, respectively; forming an encapsulant on the first insulating protection layer to encapsulate the chip; removing the carrier board; and forming a built-up structure on the first insulating protection layer and the connection columns.

Therein, when forming the first insulating protection layer, the method can further comprise the step of forming a plurality of first openings in the first insulating protection layer for exposing the connection columns, respectively.

In the above-described package structure and method, the chip can be an active component or a passive component.

In the above-described package structure and method, the height of the connection columns can be flush with, higher than or lower than the first insulating protection layer.

In the above-described package structure and method, the built-up structure can comprise at least a dielectric layer, a wiring layer formed on the dielectric layer, and a plurality of conductive vias formed in the dielectric layer and electrically connecting the wiring layer, portions of the wiring layer being formed on the first insulating protection layer and the connection columns for electrically connecting to the connection columns.

Further, a second insulating protection layer can be formed on the built-up structure, and portions of the wiring layer can be exposed from the second insulating protection layer to function as conductive pads. Furthermore, a plurality of solder balls can be formed on the conductive pads, respectively.

Therefore, before performing a built-up process to form a built-up structure, the present invention first embeds the chip in an encapsulant such that in the subsequent built-up process, the warpage of the built-up structure can be prevented through the bending resistance of the encapsulant.

BRIEF DESCRIPTION OF DRAWINGS

FIGS. 2A to 2F" are cross-sectional views showing a package structure having an embedded semiconductor component and a fabrication method thereof according to the present invention, wherein FIGS. 2C' and 2C" are different embodiments of FIG. 2C, and FIGS. 2F' and 2F" are different embodiments of FIG. 2F.

DETAILED DESCRIPTION OF PREFERRED EMBODIMENTS

The following illustrative embodiments are provided to illustrate the disclosure of the present invention, these and other advantages and effects can be apparent to those in the art after reading this specification.

FIGS. 2A to 2F show a fabrication method of a package structure having an embedded semiconductor component according to the present invention.

Figure 1A:
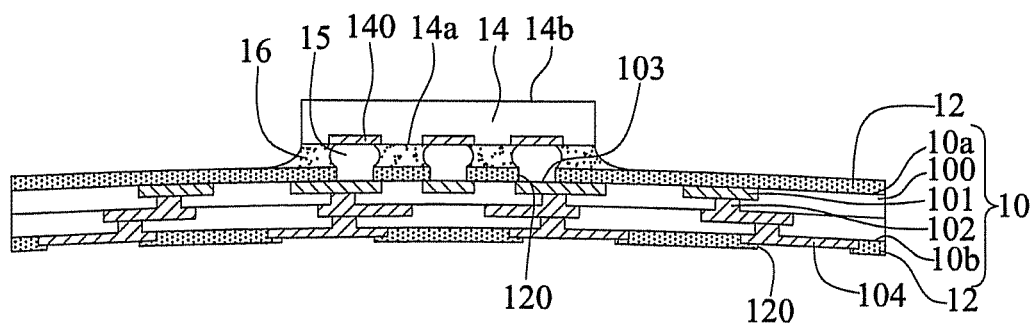
FIG. 1A is a cross-sectional view showing a conventional flip-chip semiconductor package structure.
Figure 1B:
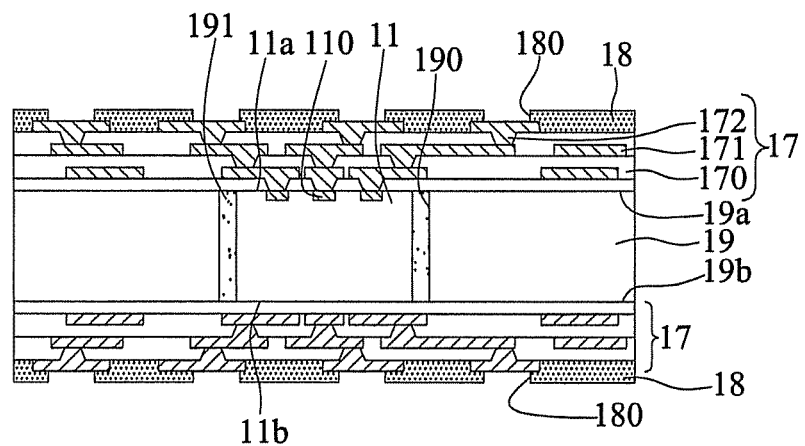
FIG. 1B is a cross-sectional view showing a conventional package structure having an embedded semiconductor component.
Figure 2A:

Referring to FIG. 2A, a carrier board 2a having two opposite surfaces is provided. The carrier board 2a has a core layer 20, a first metal layer 21 formed on two opposite surfaces of the core layer 20, a release layer 22 formed on the first metal layer 21, and a second metal layer 23 formed on the release layer 22.

The core layer 20 can be made of an organic polymer material such as BT (Bismaleimide Triazine), or a CCL (copper clad laminates) substrate having two opposite surfaces each having a prepreg dielectric material disposed thereon (not shown in the drawing).

Figure 2B:
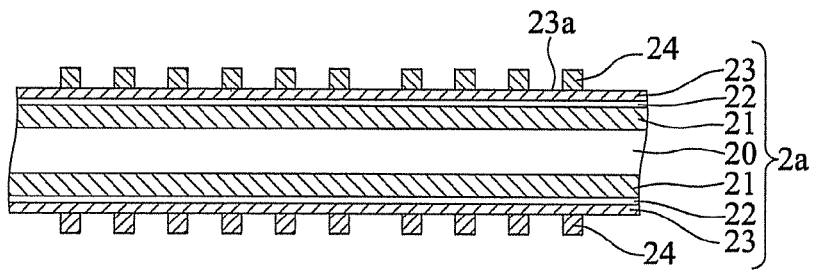

Referring to FIG. 2B, a patterning process is performed to form a plurality of connection columns 24 on the second metal layer 23 and expose portions of the upper surface 23a of the second metal layer 23. The connection columns 24 can be made of a conductive material, for example, copper.

Figure 2C:
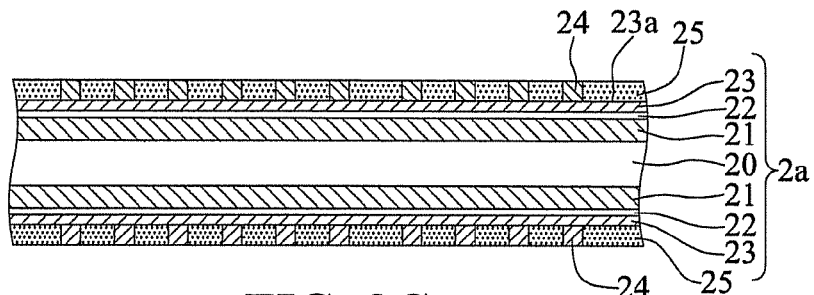
Figure 2C:
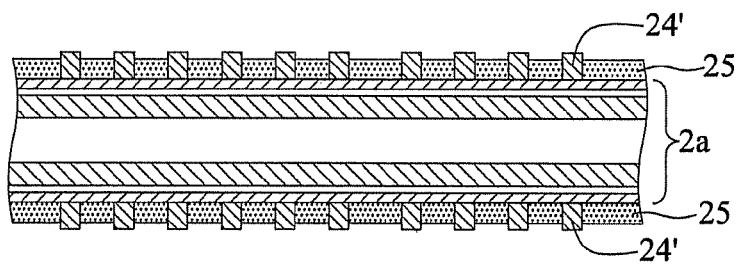
Figure 2C:
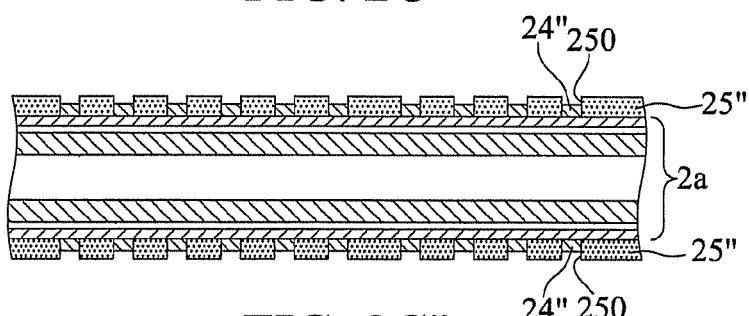

Referring to FIG. 2C, a first insulating protection layer 25 is formed on the exposed portions of the upper surface 23a of the second metal layer 23, wherein the connection columns 24 are exposed from the first insulating protection layer 25. Further, the height of the connection columns 24 is flush with the first insulating protection layer 25.

In another embodiment as shown in FIG. 2C', the height of the connection columns 24' can be higher than the first insulating protection layer 25. Alternatively, referring to FIG. 2C", a plurality of first openings 250 can be formed in the first insulating protection layer 25" for exposing the connection columns 24", respectively, and the height of the connection columns 24" can be lower than the first insulating protection layer 25".

Figure 2D:
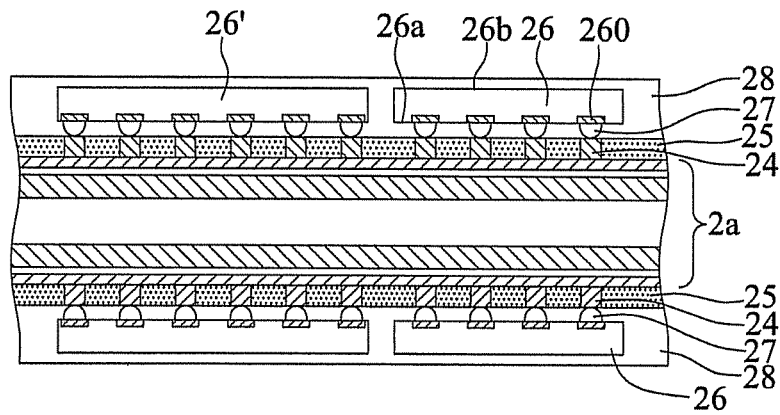

Referring to FIG. 2D, which is continued from FIG. 2C, at least a chip is mounted on the connection columns 24, wherein each chip has an active surface 26a with a plurality of electrode pads 260 and an inactive surface 26b opposite to the active surface 26a, and the electrode pads 260 are electrically connected to the connection columns 24 through solder bumps 27. The chip can be an active component (such as the chip 26') or an integrated passive component (such as the chip 26).

Subsequently, an encapsulant 28 is formed on the first insulating protection layer 25 for encapsulating the chips 26, 26' and filling the spaces between the solder bumps 27. The encapsulant 28 can be made of a dielectric material or an encapsulating material.

Figure 2E:
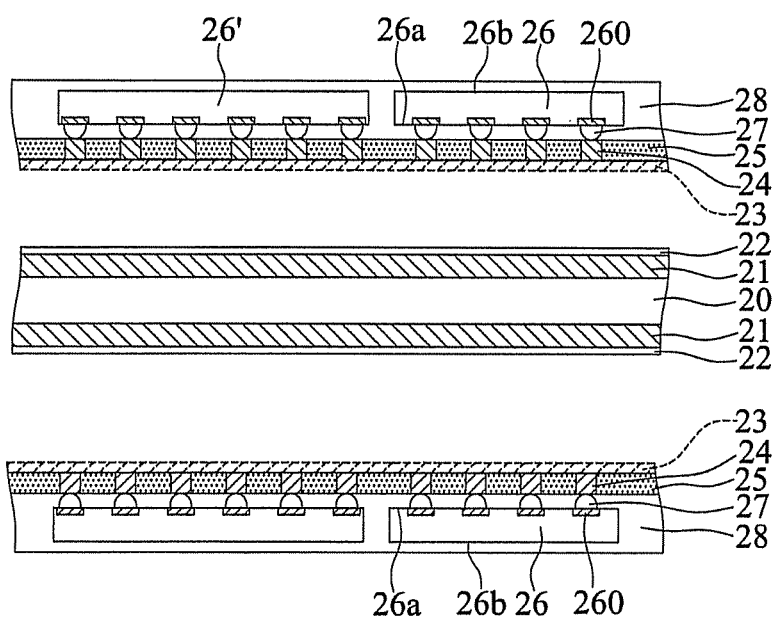

Referring to FIG. 2E, the carrier board 2a is removed to expose the first insulating protection layer 25 and the connection columns 24. Therein, the core layer 20 and the first metal layer 21 can be removed first through the release layer 22 so as to expose the second metal layer 23 on the first insulating protection layer 25, and then the second metal layer 23 can be removed by etching. Alternatively, the second metal layer 23 can be remained on the first insulating protection layer 25 so as to be used for circuit fabrication in subsequent processes.

The chips 26, 26' are mounted on the two opposite surfaces of the carrier board 2a and the encapsulant 28 is formed on the two opposite surfaces of the carrier board 2a to encapsulate the chips 26, 26', thus forming a symmetrical structure on the two surfaces of the carrier board 2a so as to prevent the deformation of the carrier board 2a caused by an uneven force and effectively prevent the warpage of the overall structure.

Referring to FIG. 2F, a built-up structure 29 is formed on the first insulating protection layer 25 and the connection columns 24. The built-up structure 29 comprises at least a dielectric layer 290, a wiring layer 291 formed on the dielectric layer 290, and a plurality of conductive vias 292 formed in the dielectric layer 290 and electrically connecting the wiring layer 291, wherein the wiring layer 291 comprises conductive lands 2910 formed on the first insulating protection layer 25 and the connection columns 24 for electrically connecting the connection columns 24 and the conductive vias 292. Further, a second insulating protection layer 30 is formed on the built-up structure 29 and a plurality of second openings 300 are formed in the second insulating protection layer 30 such that portions of the wiring layer 291 are exposed to function as conductive pads. Furthermore, solder balls 31 can be formed on the conductive pads, respectively. Thereafter, a singulation process can be performed.

Further, the wiring layer 291 on the first insulating protection layer 25 and the connection columns 24 can be formed by using the second metal layer 23 as a conductive layer through a patterning plating process. To fabricate finer pitch wiring circuit, the second metal layer 23 can be first removed by etching and then a semi-additive plating process is performed to form a conductive layer for fabrication of the wiring layer 291.

FIGS. 2F and 2F' show structures continued from FIGS. 2C' and 2C'', respectively.

Further, the first insulating protection layer 25 and the second insulating protection layer 30 can be solder mask layers.

The prevent invention prevents the warpage of the built-up structure through the bending resistance of the encapsulant 28 so as to ensure the alignment between the electrode pads 260 of the chips 26,26' and the conductive lands 2910, thereby ensuring the electrical connection quality and effectively improving the reliability of the overall package structure and the product yield.

The present invention further provides a package structure having an embedded semiconductor component, which comprises: at least a chip 26, 26' having an active surface 26a with a plurality of electrode pads 260 and an inactive surface 26b opposite to the active surface 26a; a first insulating protection layer 25, 25'' having a chip mounting area A for mounting the chip 26, 26', wherein the chip 26, 26' is mounted on the chip mounting area A via the active surface 26a thereof; a plurality of connection columns 24, 24', 24'' disposed in the first insulating protection layer 25, 25'' at positions corresponding to the electrode pads 260 and electrically connected to the electrode pads 260 through a plurality of solder bumps 27 so as to form a plurality of joints between the connection columns 24, 24', 24'' and the solder bumps 27; an encapsulant 28 formed on one surface of the first insulating protection layer 25 having the chip 26,26' mounted thereon for encapsulating the chip 26, 26' and filling the spaces between the joints; and a built-up structure 29 formed on the other surface of the first insulating protection layer 25 and the connection columns 24, 24', 24''.

The chip 26, 26' can be an active component or a passive component.

The height of the connection columns 24, 24', 24'' can be flush with, higher than or lower than the first insulating protection layer 25, 25''.

The built-up structure 29 comprises at least a dielectric layer 290, a wiring layer 291 formed on the dielectric layer 290, and a plurality of conductive vias 292 formed in the dielectric layer 290 and electrically connecting the wiring layer 291, wherein portions of the wiring layer 291 (conductive lands 2910) are formed on the first insulating protection layer 25 and the connection columns 24, 24', 24'' and electrically connecting to the connection columns 24, 24', 24''.

The package structure further comprises a second insulating protection layer 30 formed on the built-up structure 29 and having a plurality of second openings 300 for exposing portions of the wiring layer 291, wherein the exposed portions of the wiring layer 291 function as conductive pads 293 and solder balls 31 can be formed thereon.

Therefore, the present invention mounts chips on two opposite surfaces of a carrier board and forms an encapsulant to encapsulate the chips so as to form a symmetrical structure on the both surfaces of the carrier board, thus preventing the warpage of the overall structure.

Further, the present invention prevents the warpage of the built-up structure through the bending resistance of the encapsulant so as to ensure the electrical connection quality between the electrode pads of the chip and the wiring layer, thereby improving the reliability of the overall structure and the product yield.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A package structure having an embedded semiconductor component, comprising:
    a chip having an active surface with a plurality of electrode pads and an inactive surface opposite to the active surface;
    a first insulating protection layer having a chip mounting area for the chip to be mounted thereon, wherein the chip is mounted on the chip mounting area via the active surface thereof;
    a plurality of connection columns disposed in the first insulating protection layer at positions corresponding to the electrode pads and electrically connected to the electrode pads through solder bumps so as to form a plurality of joints between the connection columns and the solder bumps, wherein the connection columns are in contact with the solder bumps, and the connection columns and the solder bumps are made of different materials;
    an encapsulant formed on one surface of the first insulating protection layer having the chip mounted thereon for encapsulating the chip and filling spaces between the joints; and
    a built-up structure formed on the other surface of the first insulating protection layer and the connection columns,
    wherein side surfaces of the first insulating protection layer are flush with side surfaces of the encapsulant and side surfaces of the built-up structure, each of the connection columns has an end surface connected to a conductive land of the built-up structure, and the end surface of each of the connection columns is flush with the other surface of the first insulating protection layer.

2. The structure of claim 1, wherein the chip is an active component or a passive component.

3. The structure of claim 1, wherein the built-up structure comprises at least a dielectric layer, a wiring layer formed on the dielectric layer, and a plurality of conductive vias formed in the dielectric layer and electrically connecting the wiring layer, portions of the wiring layer being formed on the first insulating protection layer and the connection columns for electrically connecting to the connection columns.

4. The structure of claim 3, further comprising a second insulating protection layer formed on the built-up structure and having a plurality of second openings through which portions of the wiring layer are exposed to function as conductive pads.

5. The structure of claim 4, further comprising a plurality of solder balls disposed on the conductive pads, respectively.

* * * * *